1111111111111111111111111111111111
US005397724A

United States Patent [19]
Nakajima et al.

[11] Patent Number: 5,397,724
[45] Date of Patent: Mar. 14, 1995

[54] METHOD OF MAKING A NONVOLATILE MEMORY DEVICE HAVING A SIDEWALL INSULATING FILM DOPED WITH PHOSPHORUS

[75] Inventors: Hideharu Nakajima; Takeshi Yamazaki, both of Kanagawa, Japan

[73] Assignee: Sony Corporation, Tokyo, Japan

[21] Appl. No.: 67,804

[22] Filed: May 27, 1993

[30] Foreign Application Priority Data

Jun. 9, 1992 [JP] Japan .................................. 4-174817
Aug. 24, 1992 [JP] Japan .................................. 4-247398

[51] Int. Cl.6 ........................................ H01L 21/265
[52] U.S. Cl. ........................................ 437/43; 437/35; 437/240
[58] Field of Search ............... 437/35, 43, 44, 240, 437/982; 257/315, 316; 148/DIG. 133

[56] References Cited

U.S. PATENT DOCUMENTS

5,068,697 11/1991 Noda et al. ........................... 257/315
5,194,929 3/1993 Ohshima et al. ..................... 257/326
5,256,584 10/1993 Hartmann ............................. 437/43

Primary Examiner—Tom Thomas
Assistant Examiner—Chandra Chaudhari
Attorney, Agent, or Firm—Hill, Steadman & Simpson

[57] ABSTRACT

A nonvolatile memory device having a control gate laid over a floating gate via an interlayer insulating layer, wherein the side portions of the floating gate and the control gate have a side wall insulating film doped with phosphorus, whereby the retention of the charges stored at the floating gate is improved, and a process for production of a nonvolatile memory device comprising forming a gate insulating film, a floating gate, an interlayer insulating layer, and a control gate on a semiconductor substrate, then forming a side wall insulating film doped with phosphorus on the semiconductor substrate by chemical vapor deposition and anisotropically etching the side wall insulating layer so as to form a side wall insulating film doped with phosphorus at the side portions of the floating gate and the control gate.

13 Claims, 9 Drawing Sheets

METHOD OF MAKING A NONVOLATILE MEMORY DEVICE HAVING A SIDEWALL INSULATING FILM DOPED WITH PHOSPHORUS

BACKGROUND OF THE INVENTION

1. Field of the Invention

The present invention relates to a nonvolatile memory device having a floating gate and to a process for manufacture of the same, more particular relates to a nonvolatile memory device designed to improve the charge retention characteristic and a process for manufacture of the same.

2. Description of the Related Art

In a nonvolatile memory device and other semiconductor devices such as erasable and programmable read only memories (EPROMs) or electrically erasable and programmable read only memories (EEPROMs) having floating gates and control gates, the electrons are retained in the floating gate so that data will not disappear even if the power is cut after data is written. The electrons injected in the floating gate, however, gradually leak to the control gate or the semiconductor substrate in accordance with a heat discharge model.

Therefore, effort has been made to prevent the leakage of electrons injected in the floating gate so as to improve the charge retention characteristics by making the interlayer insulating layer laid between the floating gate and the control gate from an ONO film ($SiO_2$/$SiN$/$SiO_2$) superior in insulating and film-forming characteristics.

The leakage through the interlayer insulating layer can be reduced by making the interlayer insulating layer from an ONO film etc., but there is still a problem with the leakage from the side portion of the floating gate. To prevent this, the side portions of the floating gate and the control gate are sometimes covered with a side wall insulating film (referred to simply as a "side wall" here). This is to prevent the electrons injected in the floating gate from leaking in the direction of the control gate.

In the related art, the side wall is produced as follows: A floating gate and control gate are formed on the semiconductor substrate in a predetermined pattern, then a silicon dioxide film is formed on the surface of the semiconductor substrate by chemical vapor deposition (CVD). Next, the silicon dioxide film is anisotropically etched to form a side wall comprised of silicon dioxide at the side portions of the floating gate and the control gate.

However, when a nonvolatile memory device of this conventional structure was tested under high temperatures, the present inventors found that charge leakage still occurred from the floating gate. This charge leakage means a decline in the data retention rate in the case of a nonvolatile memory device. If this deteriorates, the result is a defective device.

SUMMARY OF THE INVENTION

The first object of the present invention, in consideration of this situation, is to provide a nonvolatile memory device which is improved in the charge retention characteristic and improved in the data retention characteristic even under adverse conditions such as when left at a high temperature. A second object is to provide a process for production of a nonvolatile memory device which enables production of such a nonvolatile memory device by an easy and simple process.

To achieve the above first object, the present invention provides a nonvolatile memory device which has a control gate laid over a floating gate via an interlayer insulating layer, said nonvolatile memory device having a region doped with phosphorus at the side portions of the floating gate and the control gate.

Preferably, a side wall is formed at the side portions of the floating gate and the control gate and the concentration of phosphorus at the interface between the side wall and the floating gate and/or the control gate is high.

Further, to achieve the above second object, the present invention provides a process for the production of a nonvolatile memory device comprised of the steps of forming a gate insulating layer, a floating gate, an interlayer insulating layer, and a control gate on a semiconductor substrate, then forming a phosphorus-doped side wall formation film on the surface of the semiconductor substrate by chemical vapor deposition and anisotropically etching the side wall formation film so as to form a phosphorus-doped side wall at the side portions of the floating gate and the control gate.

According to another aspect of the present invention, there is provided a process of production of a nonvolatile memory device comprised of the steps of forming a gate insulating layer, a floating gate, an interlayer insulating layer, and a control gate on a semiconductor substrate, then forming on the surface of the semiconductor substrate a multilayer side wall formation film including at least a phosphorus-doped insulating film doped with phosphorus and anisotropically etching the side wall formation film so as to form a side wall including a phosphorus-containing film at the inner side at the side portions of the floating gate and the control gate.

According to still another aspect of the present invention, there is provided a process of production of a nonvolatile memory device comprised of the steps of forming a gate insulating layer, a floating gate, an interlayer insulating layer, and a control gate on a semiconductor substrate, then doping phosphorus at the side portions of the floating gate and control gate or the side wall by oblique ion implantation or phosphorus predeposition.

DESCRIPTION OF THE PREFERRED EMBODIMENTS

Below, a detailed explanation will be made of memory devices according to embodiments of the present invention referring to the drawings.

Figure 1:
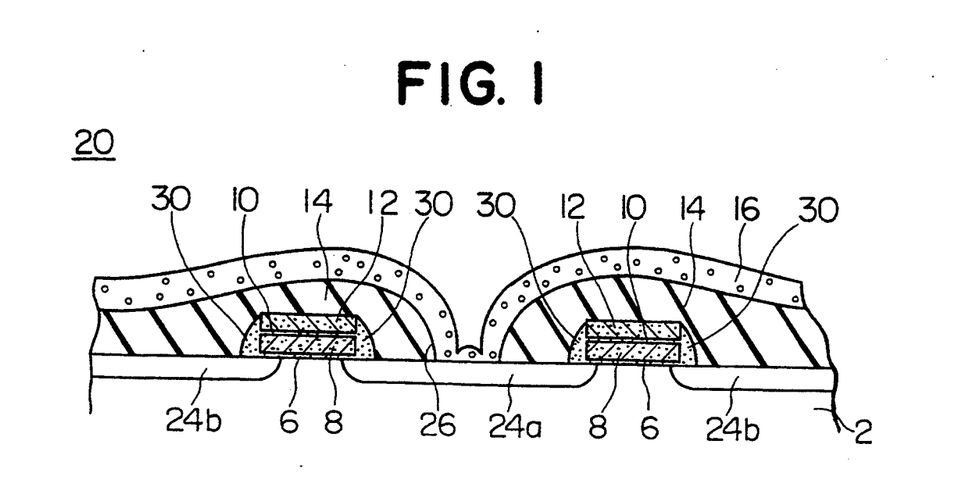
FIG. 1 is a sectional view of key portions of an EPROM according to a first embodiment of the present invention.
Figure 2:
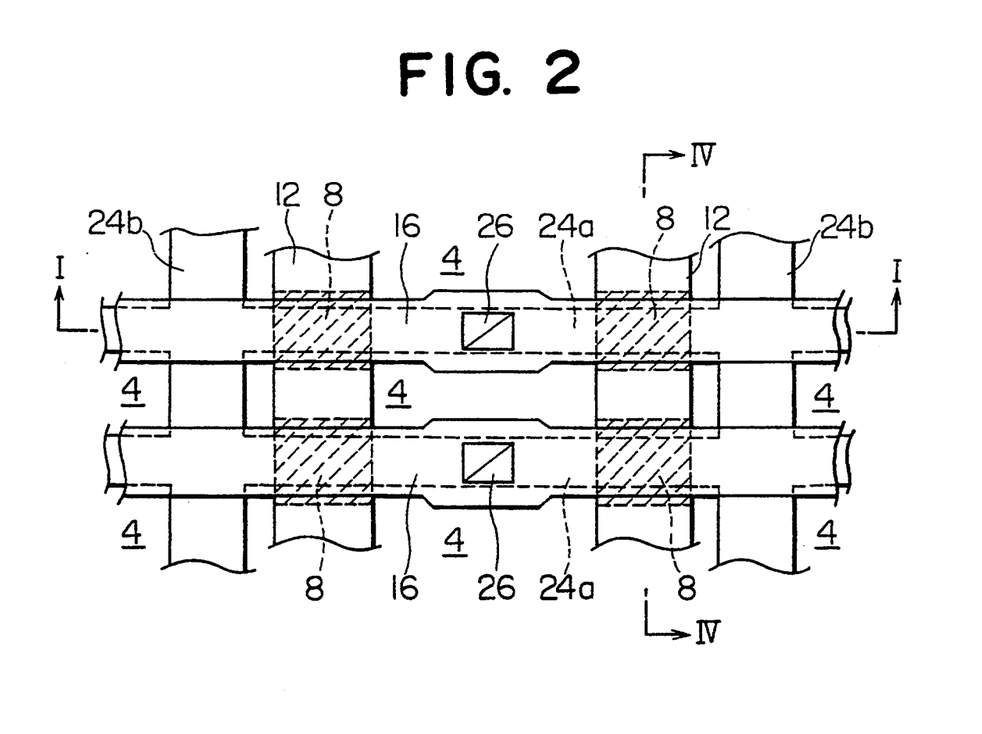
FIG. 2 is a plane view of the first embodiment of the present invention shown in FIG. 1, FIGS. 3A to 3F are process diagrams showing the steps for production of the first embodiment of the present invention shown in FIG. 1 along the line I—I of FIG. 2, FIGS. 4A to 4D are process diagrams showing the steps for production of the first embodiment of the present invention shown in FIG. 1 along the line IV—IV of FIG. 2.

FIG. 1 is a sectional view of key portions of an EPROM according to a first embodiment of the present invention, while FIG. 2 is a plane view of the first embodiment of the present invention shown in FIG. 1.

As shown in FIGS. 1 and 2, the nonvolatile memory device of the present embodiment is an EPROM 20 which is comprised, for example, of a silicon semiconductor substrate 2 on whose surface is formed selectively oxidized element isolation regions (LOCOS) 4 and gate insulating layers 6 and floating gates 8 formed on the gate insulating layers 6. The LOCOS 4 and the gate insulating layers 6 are formed by heat oxidation of the surface of the semiconductor substrate 2 and are constituted by silicon dioxide films. The floating gates 8 are comprised of polycrystalline silicon films formed, for example, by chemical vapor deposition.

On the floating gates 8 are laid control gates 12 over interlayer insulating layers 10. As the interlayer insulating layers 10, use is made for example of laminated films such as ONO films ($SiO_2/SiN/SiO_2$) with a small leakage current and superior film thickness controllability. The control gates 12 are comprised of polycrystalline silicon films or "polycide" films (laminated films comprised of tungsten silicide, molybdenum silicide, titanium silicide, tantalum silicide, or other silicide films with polycrystalline silicon films) etc.

The pattern for formation of the floating gates 8 and the control gates 12, as shown in FIG. 2, is one with a plurality of control gates 12 arranged in rows at predetermined intervals under which are arranged a plurality of floating gates 8 along the longitudinal direction of the control gates 12 at predetermined intervals. The pattern of the floating gates 8 corresponds to that of the memory cells.

As shown in FIG. 1, after the floating gates 8 and the control gates 12 are formed on the semiconductor substrate 2 in a predetermined pattern, impurity diffusion layers 24a forming the drain regions and impurity diffusion regions 24b forming the source regions are formed by self-alignment by ion implantation etc. on the surface of the semiconductor substrate 2. The impurity diffusion layers 24a and 24b are not particularly limited, but when the semiconductor substrate 2 is a P-type semiconductor substrate, they are formed by $N^+$ impurity diffusion layers.

As shown in FIG. 1, on top of the control gates 12 are laid metal electrode layers 16 comprised of aluminum etc. via the interlayer insulating layers 14 in a predetermined pattern. The metal electrode layers 16 are connected to the impurity diffusion layers 24a forming the drain regions of the memory cells through contact holes 26. On the metal electrode layers 16 are formed overcoat layers, not shown.

In the present embodiment, in such an EPROM 20, side walls 30 doped with phosphorus (P) are formed at the side portions of the floating gates 8 and the control gates 12. The concentration of phosphorus in the side walls 30 is not particularly limited, but may be 1 to 10 percent by weight, preferably 3 to 8 percent by weight. The concentration of the phosphorus need not necessarily be uniform in the side walls 30. The concentration may be made to change in steps or gradually so as to rise at the interface between the side walls 30 and the control gates 12 and/or the floating gates 8.

The side walls 30 are formed, for example, by isotropic etching of a phosphosilicate glass (PSG) film formed by chemical vapor deposition. Details of the method of formation of the side walls 30 are explained later.

Next, an explanation will be made of the process of production of the EPROM 20 of the present embodiment based on FIGS. 3A to 3F and FIGS. 4A to 4D.

FIGS. 3A to 3F are process diagrams showing the steps for production of the first embodiment of the present invention shown in FIG. 1 along the line I—I of FIG. 2, while FIGS. 4A to 4D are process diagrams showing the steps for production of the first embodiment of the present invention shown in FIG. 1 along the line IV—IV of FIG. 2.

Figure 4A:
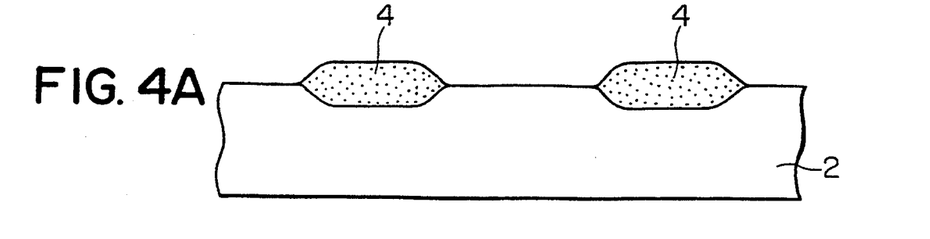

As shown in FIG. 4A, first, a semiconductor substrate 2 comprised of a silicon wafer etc. is prepared. On the surface is formed an oxide film of about 50 nm thickness for use as the pads. On top of this is formed an oxidation prevention film of about 120 nm, comprised of a silicon nitride film etc., in a predetermined pattern. Ions are implanted for the channel stopper, then the LOCOS 4 are formed by heat oxidation for element isolation of the memory cells. The conditions for ion implantation for the channel stopper are not particularly limited, but for example $B^+$ ions are implanted under conditions of energy of 50 KeV and a dosage of $1 \times 10^{13}$ /$cm^2$. The thickness of the LOCOS 4 is not particularly limited, but for example is 300 to 700 nm. Next, a gate insulating film 6 is formed by heat oxidation on the surfaces of the semiconductor substrate 2 positioned between the LOCOS 4. The conditions of the heat oxidation are for example wet oxidation at 850° to 1000° C. The thickness of the gate insulating layer 6 is not particularly limited, but for example is about 20 to 30 nm.

Figure 3A:
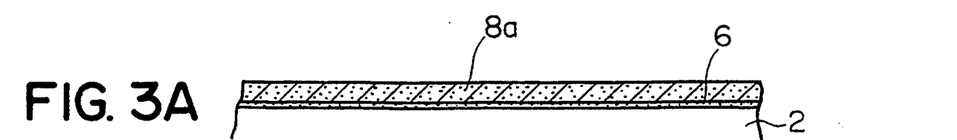

Next, as shown in FIG. 3A, a first polycrystalline silicon film 8a forming the floating gates 8 is formed by chemical vapor deposition on the surface of the gate insulating layer 6. The thickness of this first polycrystalline silicon film 8a is also not particularly limited, but for example is 100 to 300 nm, preferably 250 run or so. To raise the conductivity of the first polycrystalline silicon film 8a, phosphorus or other impurities are introduced to the first polycrystalline silicon film 8a. As the method of introducing the phosphorus, use is made of the phosphorus predeposition method etc. Use is made of gas of POCl₃ and diffusion is caused for 20 to 60 minutes at a temperature of about 800° to 1000° C. or so.

Figure 4B:
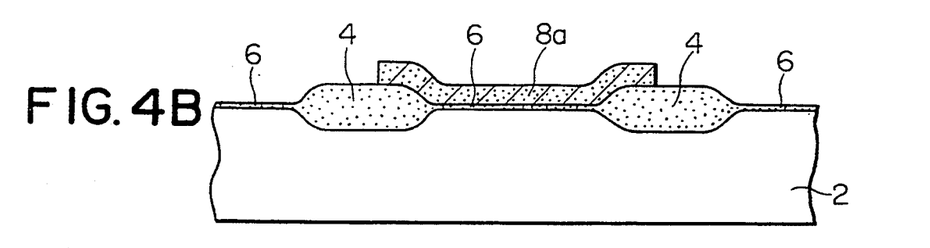
Figure 4C:
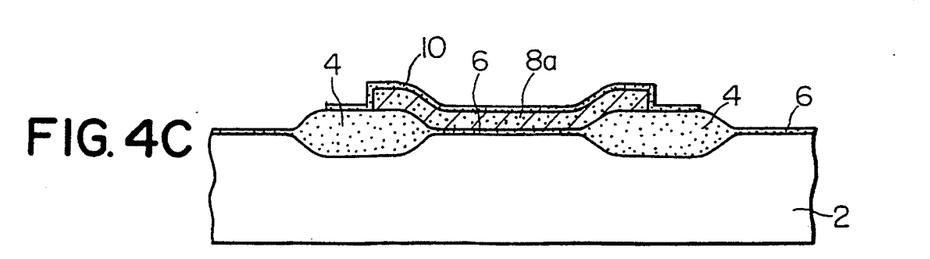

The first polycrystalline silicon film 8a is etched to a predetermined longitudinal pattern along the line I—I shown in FIG. 2. The cross-section along the direction perpendicular to FIG. 3A is shown in FIG. 4B.

Figure 3B:
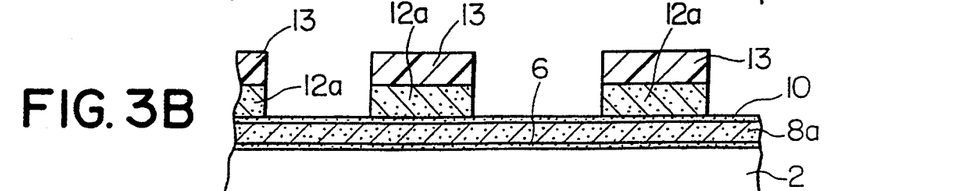

Next, as shown in FIG. 3B, an interlayer insulating layer 10 comprised for example of ONO laminated film is formed to cover the first polycrystalline silicon film 8a forming the floating gates 8. The thickness of the interlayer insulating layer 10 is not particularly limited, but for example is about 30 nm. When making the interlayer insulating layer 10 from an ONO film, an underlayer of an oxide film is formed to about 10 to 20 nm by heat oxidation etc. An intermediate silicon nitride film is formed by chemical vapor deposition to about 8 to 14 nm. An overlayer of an oxide film is formed by chemical vapor deposition to 30 to 40 nm.

Figure 3C:
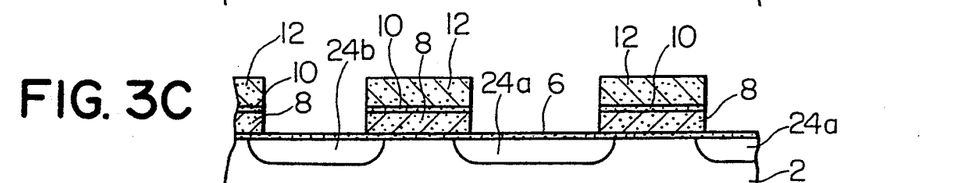
Figure 4D:
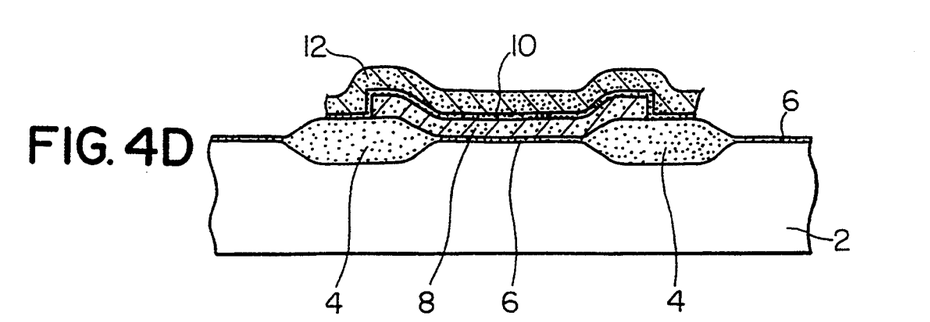

Next, a second polycrystalline silicon film 12a of a thickness of about 300 nm forming the control gates 12 is formed by chemical vapor deposition etc. on the surface of the interlayer insulating layer 10. The second polycrystalline silicon film 12a is also implanted with phosphorus or other impurities like with the case of the first polycrystalline silicon film so as to reduce its resistance. Using a resist film 13, first the second polycrystalline silicon film 12a is etched by RIE (Reactive Ion Etching) etc., then, as shown by FIG. 3C, RIE etc. is used for successive self-etching of the interlayer insulating layer 10 and the first polycrystalline silicon film 8a to obtain a predetermined pattern of floating gates 8 and control gates 12. A cross-section in the direction perpendicular to FIG. 3C is shown in FIG. 4D.

Note that when making the control gates 12 a polycide structure, the polycrystalline silicon film is formed to about 100 nm, then a metal silicide film of tungsten silicide etc. is formed to a thickness of about 150 nm by chemical vapor deposition etc.

After this, ion implantation and annealing are performed to form impurity diffusion layers 24a and 24b forming the source and drain regions on the surface of the semiconductor substrate 2 by self-alignment with the gates. The impurities used at the time of ion implantation are impurities of a conductivity type opposite to the conductivity type of the semiconductor substrate 2. When the semiconductor substrate 2 is a P type, then the impurity is an N type such as As or P. The energy at the time of ion implantation is not particularly limited, but in the case of As may be about 300 to 500 KeV and in the case of P may be about 100 to 200 KeV. The dosage is not particularly limited, but for example is about $3 \times 10^{15}$ cm$^{-2}$.

Figure 3D:
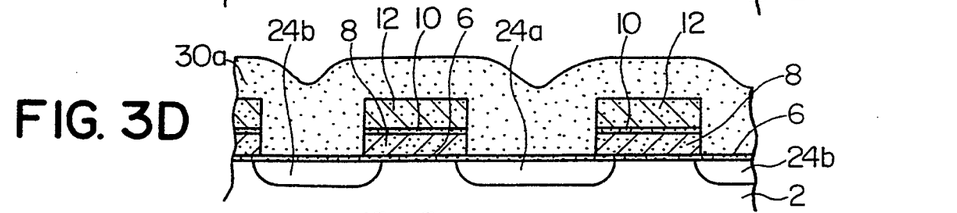

Next, as shown in FIG. 3D, a side wall formation film 30a is formed on the control gates 12. The side wall formation film 30a is constituted by a film including phosphorus etc. and is comprised for example of a phosphosilicate glass(PSG) film formed by chemical vapor deposition. The thickness of the phosphosilicate glass film is not particularly limited, but for example is about 500 nm. When forming this phosphosilicate glass film, the concentration of the phosphorus with respect to the direction of film formation may be made constant, but it is also possible to first increase the concentration of phosphorus and then lower the concentration in steps or on a gradual basis.

Figures 3E, 3F:
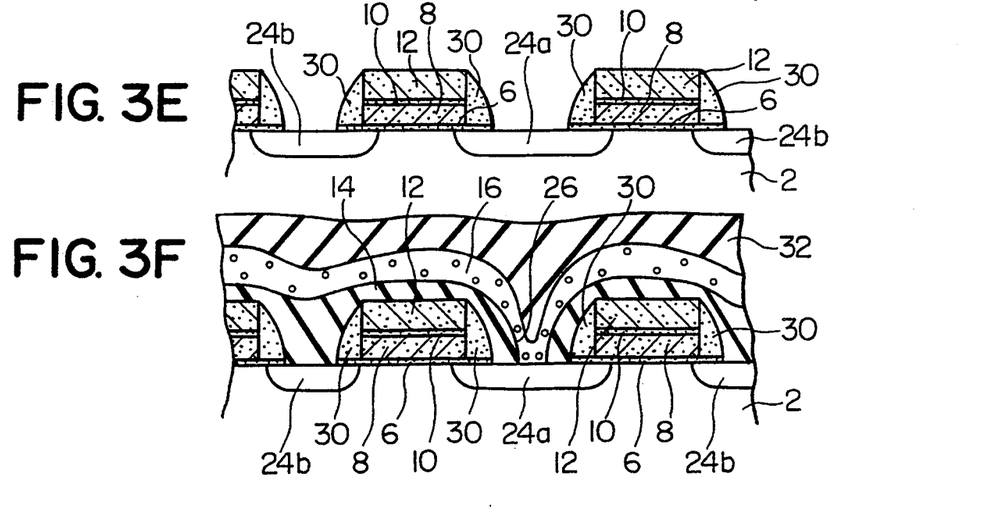

Next, as shown in FIG. 3E, the side wall formation film 30a is etched by RIE or another isotropic etching process to form the side walls 30 at the side portions of the control gates 12 and the floating gates 8. The side walls 30 are formed from a phosphosilicate glass film, so include phosphorus. To make the source-drain region diffusion layers 24a and 24b formed on the surface of the semiconductor substrate 2 an LDD (Lightly Doped Drain) structure, ion implantation for the LDD structure is performed after forming the side walls 30.

Next, as shown in FIG. 3F, an interlayer insulating layer 14 is formed on the control gates 12. The interlayer insulating layer 14 is not particularly limited, but for example is comprised of a silicon dioxide layer obtained by chemical vapor deposition. The interlayer insulating layer 14 has contact holes 26 formed in it to expose the surface of the impurity diffusion layers 24a forming the drain regions of the memory cells. A metal electrode layer 16 comprised of aluminum etc. is formed on the surface of the interlayer insulating layer 14 so as to enter into the contact holes 26 and is etched to a predetermined pattern, then an overcoat layer 32 comprised of a silicon nitride film etc. is formed by chemical vapor deposition. After this, post-processing is performed to open connection pad windows and perform RIE etc.

Figure 5:
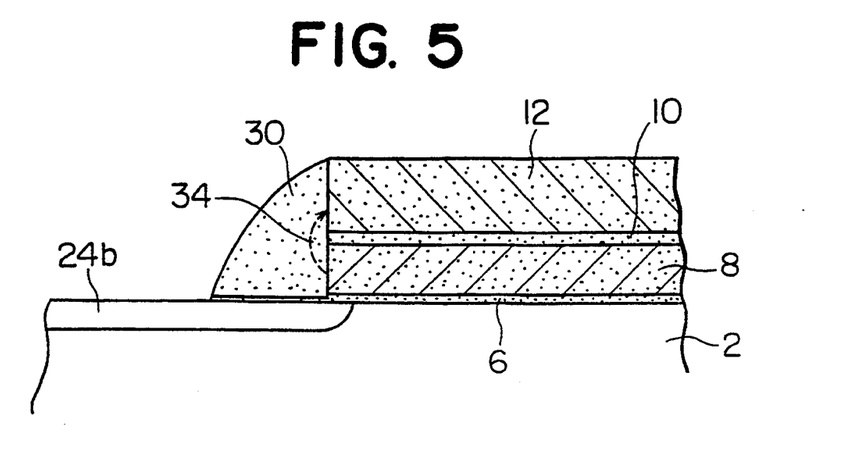
FIG. 5 is a schematic sectional view of key portions for explaining the operation of the first embodiment of the present invention shown in FIG. 1.

FIG. 5 is a schematic sectional view of key portions for explaining the operation of the first embodiment of the present invention shown in FIG. 1. In the EPROM 20 of the present embodiment, as shown in FIG. 5, since the side walls 30 are comprised by a thin film including phosphorus, such as a phosphosilicate glass film, the charge leakage through the path 34 in the side walls 30 from the side portions of the floating gates 8 is greatly reduced and it is possible to greatly improve the charge retention. The mechanism for reducing the charge leakage by making a thin film including phosphorus contact the side portions of the floating gates 8 is not necessarily clear, but it is believed that it may be due to reasons that the phosphorus-containing film blocks the contamination by Na+ etc., the movement of Na+ is prevented, the resistance as the insulating film is high, etc.

Experiments confirmed that when allowed to stand at a high temperature of about 300° C., it was possible to improve the data retention characteristic of the nonvolatile semiconductor device of the present invention to about 80 percent after the elapse of a predetermined time compared with about 40 percent for the nonvolatile semiconductor device of the related art under the same conditions.

Figure 6:
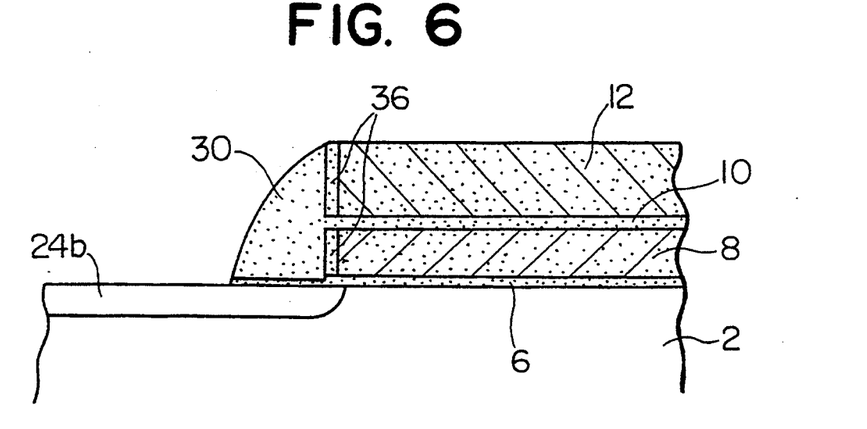
FIG. 6 is a schematic sectional view of key portions of an EPROM according to a second embodiment of the present invention.

FIG. 6 is a schematic sectional view of key portions of an EPROM according to a second embodiment of the present invention. In the embodiment shown in FIG. 6, side walls 30 comprised of a phosphosilicate glass film for example are formed, then the side portions of the floating gates 8 and the control gates 12 comprised of polycrystalline silicon film etc. are thinly oxidized by heat oxidation etc. to form the oxidized side walls 36. Since the phosphorus included in the side walls 30 is diffused into the oxidized side walls 36, it is possible to raise the concentration of phosphorus at the interface and there is a similar action as the embodiment mentioned above.

Figure 7:
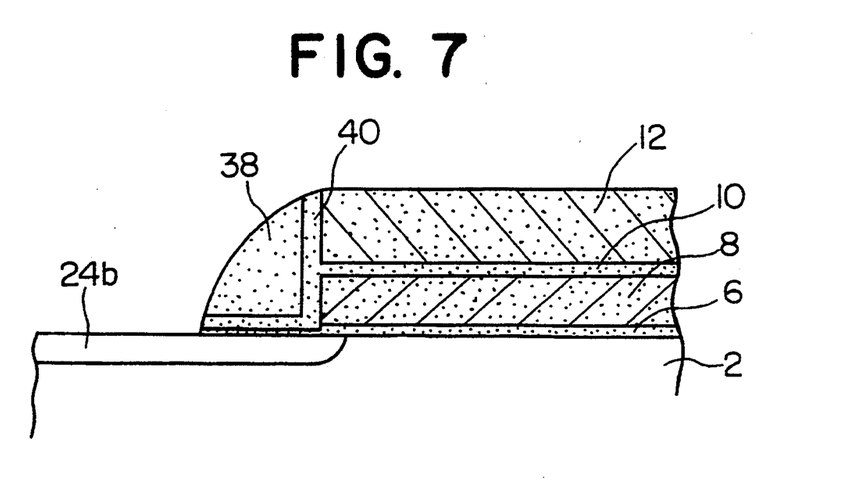
FIG. 7 is a schematic sectional view of key portions of an EPROM according to a third embodiment of the present invention.

FIG. 7 is a schematic sectional view of key portions of an EPROM according to a third embodiment of the present invention. In this embodiment, a phosphorus containing film 40 doped with phosphorus is provided at the inner sides of the side walls 38 contacting the gates 8 and 12. The phosphorus containing film 40 is comprised of a phosphosilicate glass film etc. of a thickness of preferably over 50 nm, for example, about 100 nm. The side walls 38 themselves are comprised for example of a silicon dioxide film etc. formed by chemical vapor deposition with a good coverage.

Figure 8A:
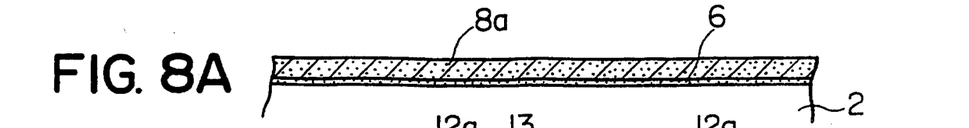
FIGS. 8A to 8F are process diagrams showing the steps for production of the third embodiment of the present invention shown in FIG. 7.
Figure 8B:
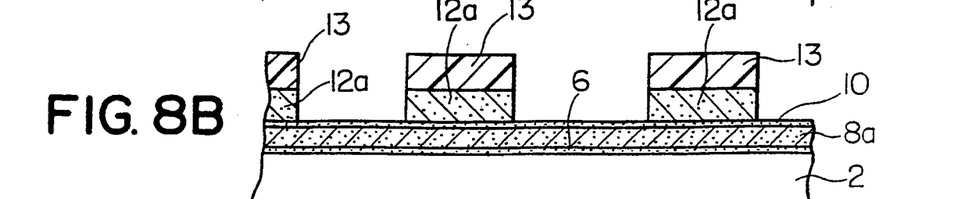
Figure 8C:
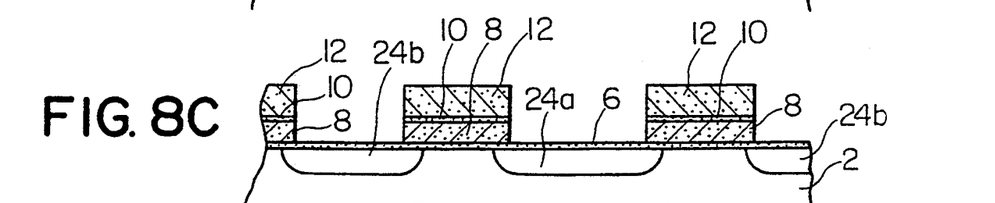

FIGS. 8A to 8F are process diagrams showing the steps for production of the third embodiment of the present invention shown in FIG. 7. The steps shown in FIGS. 8A to 8C are similar to the steps shown in FIGS. 3A to 3C, so an explanation thereof is omitted.

Figure 8D:
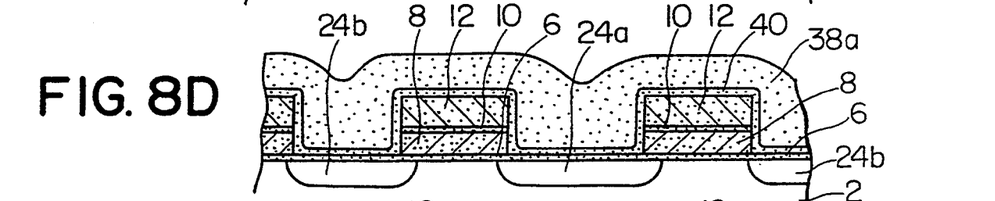

In this embodiment, as shown in FIG. 8D, first a phosphosilicate glass film comprising the phosphorus containing film 40 is formed by chemical vapor deposition etc. on the control gates 12. The thickness of the phosphosilicate glass film is not particularly limited, but preferably is at least 50 nm, for example, 100 nm. The concentration of the phosphorus in the phosphorus containing film 40 is not particularly limited, but for example is 5.0 percent by weight. Next, a side wall formation film 38a comprised by for example a silicon dioxide film is formed for example by the TEOS (Tetraethylorthosilicate) chemical vapor deposition method. The thickness of the side wall formation film 38a is not particularly limited, but for example is 200 to 400 nm. The total thickness of the phosphorus containing film 40 and the side wall formation film 38a is preferably at least 300 nm. The width of the resultant side walls 38 is made at least 0.2 μm due to requirements of the writing characteristics.

Figure 8E:
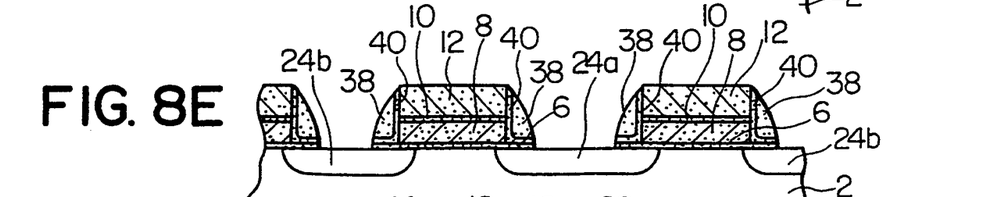

Next, as shown in FIG. 8E, the side wall formation film 38a and the phosphorus containing film 40 are etched back by RIE and other isotropic etching to form side walls 38 having a phosphorus containing film 40 at the inner sides at the side portions of the control gates 12 and the floating gates 8. Next, to make the source-drain region diffusion layers 24a and 24b formed on the surface of the semiconductor substrate 2 an LDD structure, LDD ion implantation for the LDD structure is performed after forming the side walls 30.

Figure 8F:
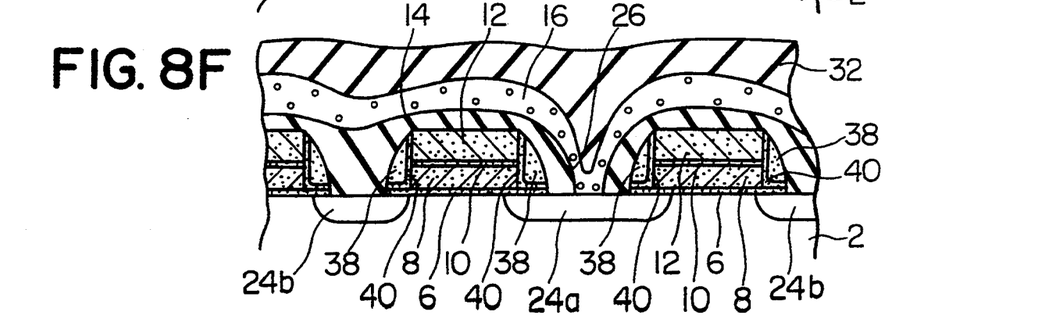

Next, as shown in FIG. 8F, an interlayer insulating layer 14 is formed on the control gates 12. The interlayer insulating layer 14 is not particularly limited, but for example is comprised of a silicon dioxide layer obtained by chemical vapor deposition. The interlayer insulating layer 14 has contact holes 26 formed in it to expose the surface of the impurity diffusion layers 24a forming the drain regions of the memory cells. A metal electrode layer 16 comprised of aluminum etc. is formed on the surface of the interlayer insulating layer 14 so as to enter into the contact holes 26 and is etched to a predetermined pattern, then an overcoat layer 32 comprised of a silicon nitride film etc. is formed by chemical vapor deposition. After this, post-processing is performed to open connection pad windows and perform RIE etc.

The EPROM of the present embodiment also has a similar effect as the above-mentioned embodiment. In particular, according to this embodiment, since the outer side portions of the thin film of phosphosilicate glass etc. at the side walls are comprised by the same chemical vapor deposition silicon dioxide film as in the past, the coverage by the chemical vapor deposition for forming the side walls becomes good. Further, it is possible to prevent the diffusion of phosphorus from the phosphosilicate glass or other thin film to the outside and possible to prevent the reduction of the concentration of the phosphorus in the phosphosilicate glass or other film contacting the gates 8 and 12.

Further, in this embodiment, unlike the embodiment shown in FIG. 6, no heat treatment is performed for oxidation of the side walls after the formation of the side walls, so the time required for heat treatment can be shortened.

Figure 9:
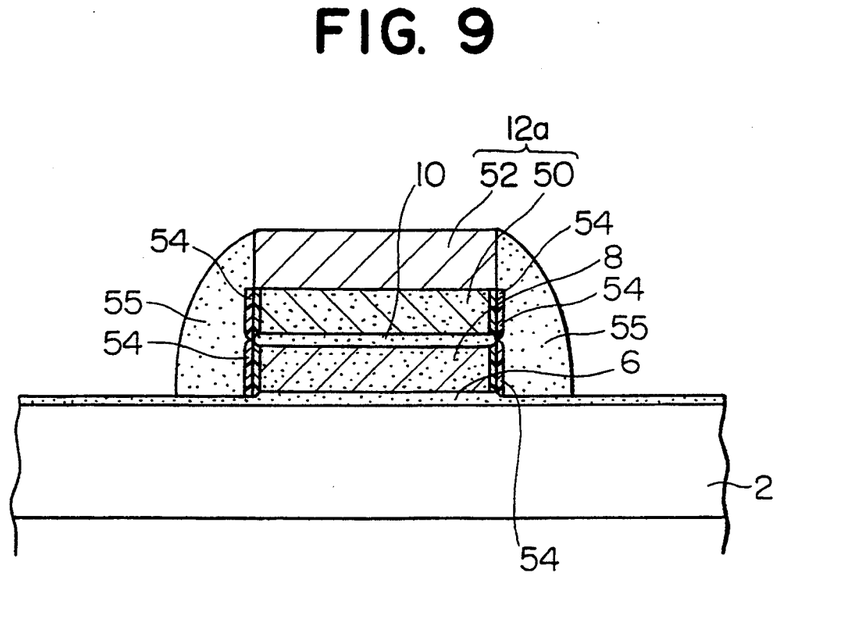
FIG. 9 is a schematic sectional view of key portions of an EPROM according to a fourth embodiment of the present invention.
Figure 10:
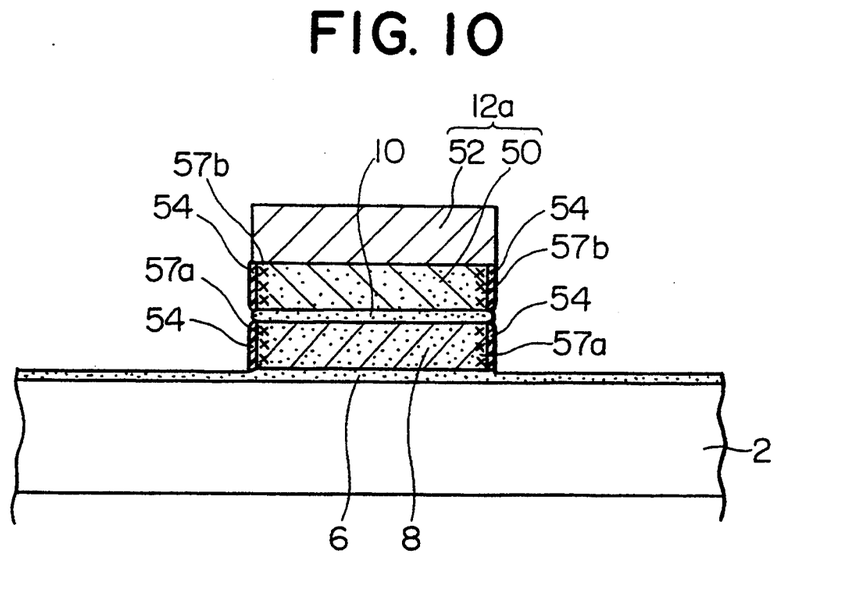
FIG. 10 is a schematic sectional view showing part of the steps for production of the fourth embodiment of the present invention shown in FIG. 9.

FIG. 9 is a schematic sectional view of key portions of an EPROM according to a fourth embodiment of the present invention. FIG. 10 is a schematic sectional view showing part of the steps for production of the fourth embodiment of the present invention shown in FIG. 9.

In this embodiment, the control gates 12a are made a polycide structure comprised of a second polycrystalline silicon film 50 and a silicide film 52 of tungsten silicide etc. A phosphorus containing film 54 is formed at the interface between the side walls 55 comprised by silicon dioxide film formed by chemical vapor deposition and the polycrystalline silicon film and at the interface between the side walls 55 and the second polycrystalline silicon film 50 of the control gates 12a. The phosphorus containing film 54 is for example comprised by a phosphosilicate glass film.

In this embodiment, to obtain an EPROM of this structure, as shown in FIG. 10, an interlayer insulating layer 10 is formed in the same way as the above-mentioned embodiment, then the second polycrystalline silicon film 50 and silicide film 52 are formed laid on top. After this, the silicide film 52 and the second polycrystalline silicon film 50 are etched to a predetermined pattern, whereby the control gates 12a are obtained. The control gates 12a are made such a polycide structure to reduce the resistance of the control gates.

Next, the interlayer insulating layer 10 and the first polycrystalline silicon film comprising the floating gates 8 are successively etched to obtain a predetermined pattern of floating gates 8. In the present embodiment, phosphorus is introduced to the side portions 57a of the first polycrystalline silicon film comprising the floating gates 8 and the side portions 57b of the second polycrystalline silicon film of the control gates 12a. As the method of introducing the phosphorus, consideration may be given to the phosphorus predeposition method, the oblique ion implantation method, etc. When doing this by the phosphorus predeposition method, it is preferable to introduce the phosphorus in an atmosphere of a gas of POCl$_3$ at a temperature of 850° C. for about 20 minutes. By this phosphorus predeposition, a phosphorus containing film 54 comprised of phosphosilicate glass is formed at the side portions 57a of the first polycrystalline silicon film comprising the floating gates 8 and the side portions 57b of the second polycrystalline silicon film of the control gates 12a. The concentration of the phosphorus included in the phosphorus containing film 54 at this time is not particularly limited, but for example is 6.0 percent by weight.

Note that after the usual diffusion of the phosphorus by the phosphorus predeposition in the polycrystalline silicon film, a step of removing the phosphosilicate glass film on the surface is required, but in this embodiment, positive use is made of the phosphosilicate glass film as a phosphorus containing film.

Next, in the present embodiment, as shown in FIG. 9, side walls 55 comprised of silicon dioxide film etc. formed by chemical vapor deposition are formed by the same steps as the above-mentioned embodiment. In this case, the phosphorus containing film 54 comprised of phosphosilicate glass etc. is a thin 2 to 3 nm, so the side walls 55 comprised of silicon dioxide film can be formed with good coverage by the chemical vapor deposition method.

Finally, heat oxidation treatment is performed through the side walls 55. In this case, since the concentration of phosphorus is high at the side portions of the second polycrystalline silicon film 50 of the control gates 12a and the side portions of the first polycrystalline silicon film comprising the floating gates 8, the thickness of the phosphorus containing film 54 formed at the interface with the side walls is formed further thicker. The final concentration of phosphorus of the phosphorus containing film 54 is about 5.0 percent by weight.

In this embodiment, it is possible to form the side walls with good coverage compared with the case of forming the side walls 55 themselves by a phosphosilicate glass film.

In the embodiments shown in FIGS. 9 and 10, when forming the phosphosilicate glass film or other phosphorus containing film 54 by the oblique ion implantation method, it is possible to perform the oblique ion implantation and the heat diffusion of phosphorus after forming the side walls 55.

Figure 11:
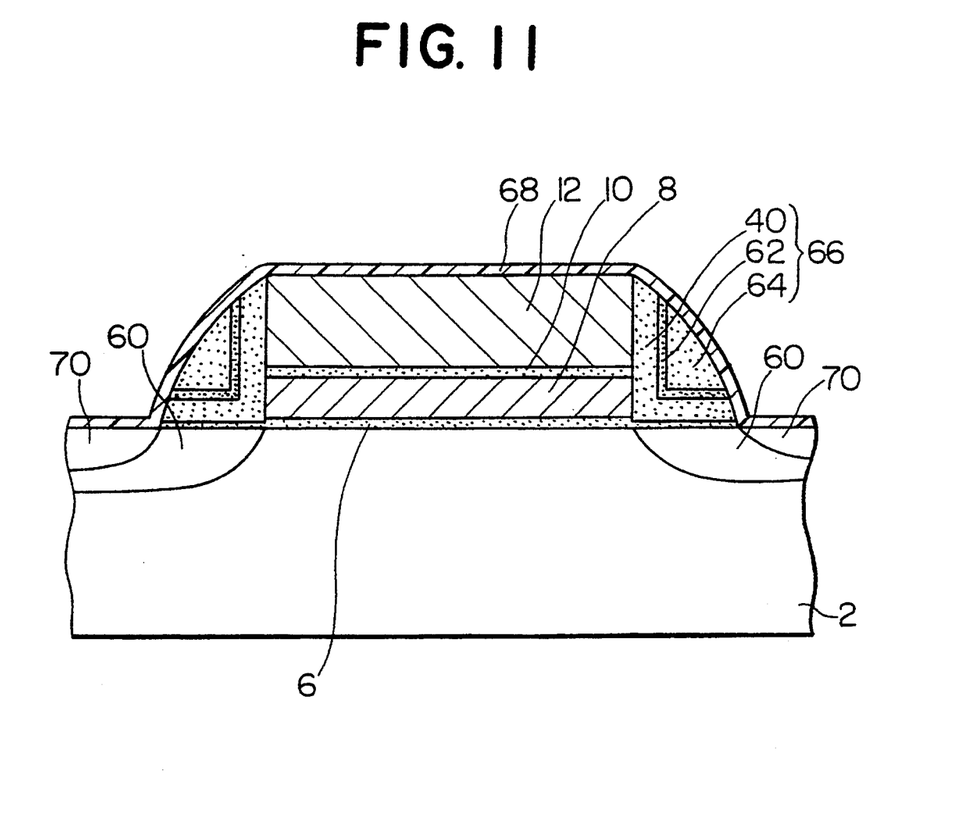
FIG. 11 is a schematic sectional view of key portions of an EPROM according to a fifth embodiment of the present invention.

FIG. 11 is a schematic sectional view of key portions of an EPROM according to a fifth embodiment of the present invention. FIGS. 12A to 12D are process diagrams showing the steps for production of the fifth embodiment of the present invention shown in FIG. 11.

In the embodiment, the side walls 66 are comprised of multilayer films including phosphorus containing films 40 contacting the side portions of the control gates 12 and floating gates 8, silicon dioxide films 62 forming the oxidation prevention films contacting the outer side, and silicon dioxide films 64 laid on the outer side. Further, on the top of the control gates 12 and the side walls 66 are laid a cap layer 68 to cover the same.

Figure 12A:
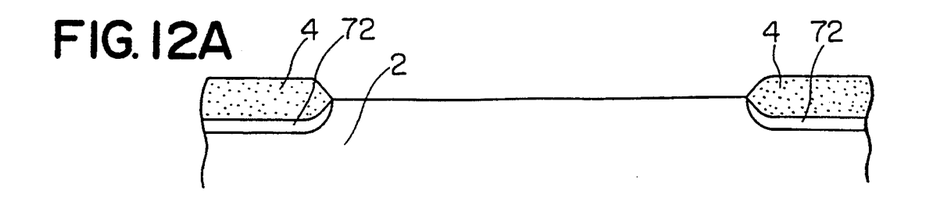
FIGS. 12A to 12D are process diagrams showing the steps for production of the fifth embodiment of the present invention shown in FIG. 11.

To produce the EPROM according to the embodiment, first, as shown in FIG. 12A, a semiconductor substrate 2 comprised of a silicon wafer etc. is prepared. On the surface is formed an oxide film of about 50 nm thickness for use as the pads. On top of this is formed an oxidation prevention film of about 120 nm, comprised of a silicon nitride film etc., in a predetermined pattern. Ions are implanted for the channel stoppers, then the LOCOS 4 are formed by heat oxidation for element isolation of the memory cells. The conditions for ion implantation for the channel stoppers are not particularly limited, but for example B+ ions are implanted under conditions of energy of 50 KeV and a dosage of $1 \times 10^{13}/cm^2$. Using the channel stoppers, channel stopper regions 72 are formed under the LOCOS 4.

Figure 12B:
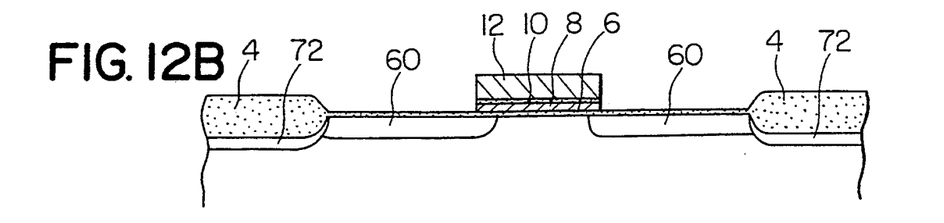

The thickness of the LOCOS 4 is not particularly limited, but for example is about 400 nm. Next, as shown in FIG. 12B, a gate insulating layer 6 is formed by heat oxidation on the surfaces of the semiconductor substrate 2 positioned between the LOCOS 4. The conditions of the heat oxidation are for example wet oxidation at 850° to 1000° C. The thickness of the gate insulating layer 6 is not particularly limited, but for example is about 20 nm.

Next, as shown in FIG. 12B, a first polycrystalline silicon film forming the floating gates 8 is formed by chemical vapor deposition etc. on the surface of the gate insulating layer 6. The thickness of this first polycrystalline silicon film is also not particularly limited, but for example is 150 nm. To raise the conductivity of the first polycrystalline silicon film, phosphorus or other impurities are introduced to the first polycrystalline silicon film. As the method of introducing the phosphorus, use is made of the phosphorus predeposition method etc. Use is made of gas of POCl$_3$ and diffusion is caused for 50 minutes at a temperature of about 950° C. or so.

The first polycrystalline silicon film is etched to a predetermined longitudinal pattern, then the surface is heat oxidized etc. so as to form the interlayer insulating layer 10. The thickness of the interlayer insulating layer 10 is not particularly limited, but is for example about 25 nm. Note that when the interlayer insulating layer 10 is made an ONO film, an underlayer of an oxide layer is formed by heat oxidation etc. to about 10 to 20 nm, an intermediate silicon nitride film is formed by chemical vapor deposition to about 8 to 14 nm, and an overlayer of an oxide film is formed by chemical vapor deposition to 30 to 40 nm.

Next, a second polycrystalline silicon film of a thickness of about 200 nm forming the control gates 12 is formed by chemical vapor deposition etc. on the surface of the interlayer insulating layer 10. The second polycrystalline silicon film is also implanted with phosphorus or other impurities like with the case of the first polycrystalline silicon film so as to reduce its resistance. Using a resist film, first the second polycrystalline silicon film is etched by RIE etc., then RIE etc is used for successive self-etching of the interlayer insulating layer 10 and the first polycrystalline silicon film to obtain a predetermined pattern of floating gates 8 and control gates 12.

Note that when making the control gates 12 a polycide structure, the polycrystalline silicon film is formed to about 100 nm, then a metal silicide film of tungsten silicide etc. is formed to a thickness of about 150 nm by chemical vapor deposition etc.

After this, ion implantation and annealing are performed to form the first impurity diffusion layer forming the source and drain regions of the LDD structure on the surface of the semiconductor substrate 2 by self-alignment with the gate. The impurities used at the time of ion implantation are impurities of a conductivity type opposite to the conductivity type of the semiconductor substrate 2. When the semiconductor substrate 2 is a P-type, then the impurity is an N type such as As or P. The energy at the time of ion implantation is not particularly limited, but in the case of P may be about 50 KeV. The dosage is not particularly limited, but for example is about $8 \times 10^{14}$ cm$^{-2}$.

Figure 12C:
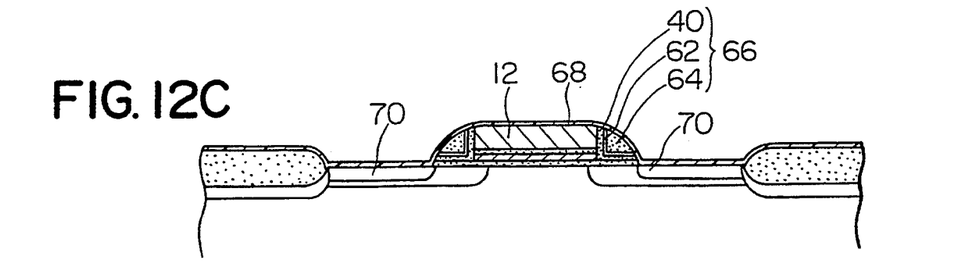

Next, as shown in FIG. 12C, first a phosphosilicate glass film comprising the phosphorus containing film 40 is formed by chemical vapor deposition etc. on the control gates 12. The thickness of the phosphosilicate glass film is not particularly limited, but for example is about 100 nm. The concentration of the phosphorus in the phosphorus containing film 40 is not particularly limited, but for example is 5.0 percent by weight. Next, a silicon nitride film 62 serving as an oxidation prevention film and a silicon dioxide film 64 for formation of the outermost wall of the side walls are formed by the continuous chemical vapor deposition method. The thickness of the silicon nitride film 62 is not particularly limited, but for example is 10 nm. The thickness of the silicon dioxide film 64 is about 300 nm. The thicknesses of the phosphorus containing film 40, the silicon nitride film 62, and the silicon dioxide film 64 are not particularly limited, but the total thickness may be changed within the range of 350 to 600 nm for example. For example, the thickness of the phosphorus containing film+silicon nitride film+silicon dioxide film may be changed to 50+10+350 nm, 300+10+100 nm, 100+5+400 nm, or 100+50+400 nm.

Figure 12D:
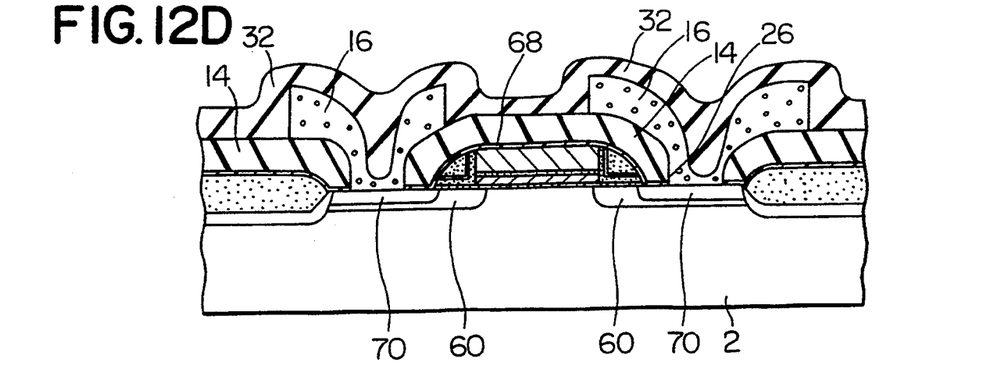

Next, the films 40, 62, and 64 are etched back by RIE or other isotropic etching to form side walls 64 having phosphorus containing film 40 and silicon nitride film 62 at the side portions of the control gates 12 and the floating gates 8. Next, as shown in FIG. 12D, a cap layer 68 of about 50 nm comprised of a silicon dioxide film is formed, then ion implantation is performed for obtaining source-drain regions of the LDD structure. Heat diffusion is then performed to obtain a high purity second impurity diffusion layer 70. The dosage at the time of ion implantation is not particularly limited, but is for example $5 \times 10^{15}$ cm$^{-2}$. At the time of the heat treatment for formation of the source-drain regions, the phosphorus containing film 40 is positioned at the inner side of the silicon nitride film 62 as the oxidation prevention film, so diffusion of the phosphorus by heat oxidation at the interface between the phosphorus containing film 40 and the control gates 12 or the floating gates 8 is prevented and the phosphorus concentration of the phosphorus containing film 40 is held at a high level. As a result, the charge retention is improved.

Next, an interlayer insulating layer 14 is formed on the cap layer 68. The interlayer insulating layer 14 is not particularly limited, but is comprised of a silicon dioxide layer obtained by chemical vapor deposition etc. The interlayer insulating layer 14 has contact holes 26 formed in it near the impurity diffusion layers 70 forming the drain regions of the memory cells. A metal electrode layer 16 comprised of aluminum etc. is formed on the surface of the interlayer insulating layer 14 so as to enter into the contact holes 26 and is etched to a predetermined pattern, then an overcoat layer 32 comprised of a silicon nitride film etc. is formed by chemical vapor deposition. After this, post-processing is performed to open connection pad windows and perform RIE etc. The thickness of the metal electrode layer 16 is not particularly limited, but for example is about 1000 nm.

In this embodiment, there is a silicon nitride film 62 formed as an oxidation prevention layer at the outer side of the phosphorus containing film 40, so even during heat treatment for forming the source-drain regions, diffusion of phosphorus due to heat oxidation can be prevented at the interface of the phosphorus containing film 40 and the control gates 12 or the floating gates 8 and the concentration of phosphorus in the phosphorus containing film 40 can be held at a high level. As a result, the charge retention is improved.

Figure 13:
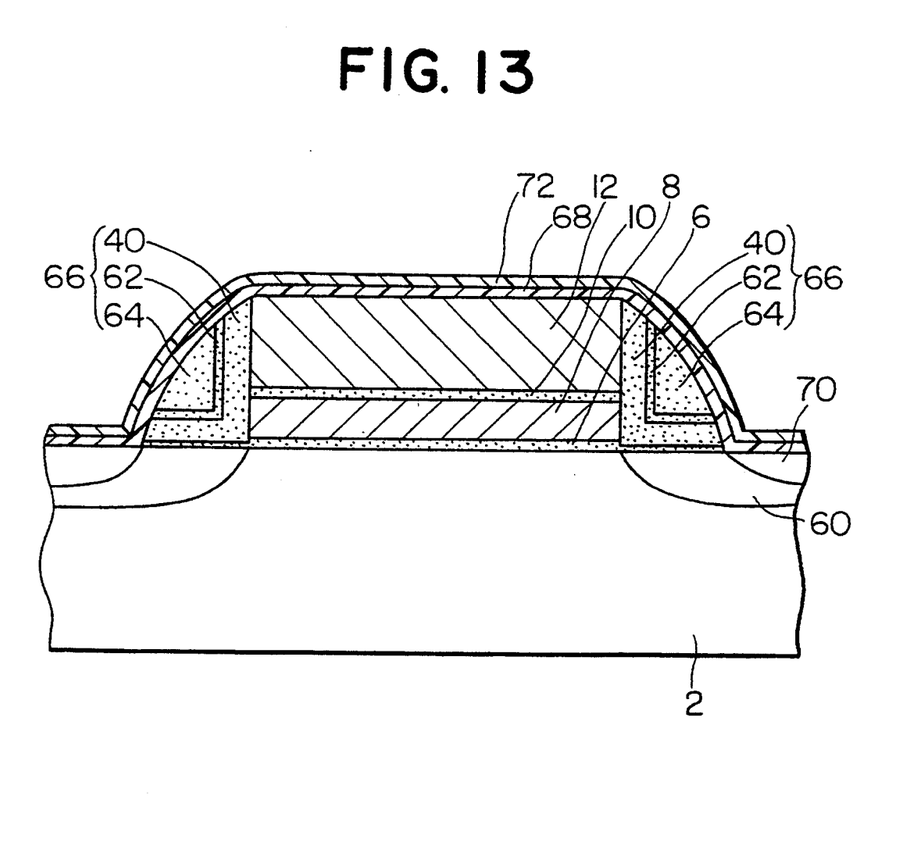
FIG. 13 is a schematic sectional view of key portions of a modification of the fifth embodiment of the present invention shown in FIG. 11.

FIG. 13 shows a modification of the embodiment shown in FIGS. 11 and 12. As shown in the figure, at the outer side of the cap layer 68 formed of a silicon dioxide film, provision is made of an oxidation prevention cap layer 72 formed by a silicon nitride film. The thickness of the oxidation prevention cap layer 72 is not particularly limited, but for example is 50 nm or so.

According to this embodiment, heat treatment is performed to form source-drain regions after the formation of the oxidation prevention cap layer 72, so diffusion of phosphorus due to heat oxidation is prevented at the interface between the phosphorus containing film 40 and the control gates 12 or the floating gates 8 and the concentration of phosphorus of the phosphorus containing film 40 is maintained at a high level. As a result, the charge retention is improved. In this embodiment, since the oxidation prevention cap layer 72 prevents diffusion of phosphorus by heat oxidation at the interface between the phosphorus containing film 40 and the control gates 12 or the floating gates 8, the silicon nitride film 62 in the side walls 66 becomes superfluous and it is possible to form the side walls 66 as a whole by a phosphosilicate glass film or a phosphosilicate glass film plus a silicon dioxide film.

Note that the present invention is not limited to the above embodiments and includes various modifications within the scope of the claims.

For example, in the above embodiments, illustration was made of application of the present invention to an EPROM, but the present invention may also be applied to all semiconductors having floating gates, such as E$^2$PROMs and flash-type E$^2$PROMs.

As explained above, according to the present invention, by forming a phosphorus-doped region at the side portions of the floating gates and control gates, it is possible to tremendously reduce the charge leakage from the side portions of the floating gates and to tremendously improve the charge retention. Experiments confirmed that when allowed to stand at a high temperature of 300° C. or so, the data retention characteristic of the nonvolatile memory device of the present invention after the elapse of a predetermined time could be improved to about 80 percent compared with about 40 percent for a nonvolatile memory device of the related art under the same conditions.

In particular, according to the present invention, in which side walls including a thin film of phosphosilicate glass or the like doped with phosphorus are formed, it is possible to make the outer side portion of the phosphosilicate glass or other thin film at the side walls by a silicon dioxide film formed by chemical vapor deposition and the chemical vapor deposition coverage for forming the side walls becomes excellent. Further, it is possible to prevent diffusion of phosphorus to the outside from the phosphosilicate glass or other thin layer and it is possible to prevent a decline in the concentration of phosphorus in the phosphosilicate glass or other thin layer contacting the gates.

We claim:

1. A process for production of a nonvolatile memory device, comprising the steps of:

forming a first insulating layer over a semiconductor substrate, forming a floating gate on said first insulating layer, forming a second insulating layer over said floating gate, forming a control gate over said second insulating layer, forming a side wall formation film doped with phosphorus over said semiconductor substrate by chemical vapor deposition, and anisotropically etching said side wall formation film to form a side wall doped with phosphorus at the side portion of the floating gate and control gate, wherein said side wall formation film is a multilayer film formed by providing an insulating layer not doped with phosphorus at the outer side of said phosphorus containing film.

2. A process for production of an electrically programmable memory device, wherein a dielectric layer doped with phosphorus is formed covering a side surface of a first polycrystalline silicon film and a second polycrystalline silicon film to reduce long-term charge loss in said device, comprising the steps of:

forming a first polycrystalline silicon film over a gate silicon dioxide layer, selectively removing said first polycrystalline silicon film, forming an interlayer dielectric layer over said first polycrystalline silicon film, forming a second polycrystalline silicon film over said interlayer dielectric layer, selectivity removing said second polycrystalline silicon film, said interlayer dielectric layer, and said first polycrystalline silicon film, depositing a doped insulating layer doped with phosphorus over said second polycrystalline silicon film, and anisotropically etching said doped insulating layer in order to form a side wall covering the side surface of said first polycrystalline silicon film and said second polycrystalline silicon film, wherein said side wall formation film is a multilayer film formed by providing an insulating layer not doped with phosphorus at the outer side of said phosphorus containing film.

3. A process for production of a nonvolatile memory device, comprising the steps of:

forming a first insulating layer over a semiconductor substrate, forming a floating gate on said first insulating layer, forming a second insulating layer over said floating gate, forming a control gate over said second insulating layer, forming a side wall formation film doped with phosphorus over said semiconductor substrate by chemical vapor deposition, and anisotropically etching said side wall formation film to form a side wall doped with phosphorus at the side portion of the floating gate and control gate, wherein heat treatment is performed for oxidation after said side wall is formed.

4. A process for production of an electrically programmable memory device, wherein a dielectric layer doped with phosphorus is formed covering a side surface of a first polycrystalline silicon film and a second polycrystalline silicon film to reduce long-term charge loss in said device, comprising the steps of:

forming a first polycrystalline silicon film over a gate silicon dioxide layer, selectively removing said first polycrystalline silicon film, forming an interlayer dielectric layer over said first polycrystalline silicon film, forming a second polycrystalline silicon film over said interlayer dielectric layer, selectivity removing said second polycrystalline silicon film, said interlayer dielectric layer, and said first polycrystalline silicon film, depositing a doped insulating layer doped with phosphorus over said second polycrystalline silicon film, and anisotropically etching said doped insulating layer in order to form a side wall covering the side surface of said first polycrystalline silicon film and said second polycrystalline silicon film, wherein heat treatment is performed for oxidation after said side wall is formed.

5. A process for production of an electrically programmable memory device, wherein a dielectric layer doped with phosphorus is formed covering a side surface of a first polycrystalline silicon film and a second polycrystalline silicon film to reduce long-term charge loss in said device, comprising the steps of:

forming a first polycrystalline silicon film over a gate silicon dioxide layer, selectively removing said first polycrystalline silicon film, forming an interlayer dielectric layer over said first polycrystalline silicon film, forming a second polycrystalline silicon film over said interlayer dielectric layer, selectivity removing said second polycrystalline silicon film, said interlayer dielectric layer, and said first polycrystalline silicon film, doping a side surface of said first polycrystalline silicon film and said second polycrystalline silicon film with phosphorus by oblique ion implantation, depositing an insulating layer over said second polycrystalline silicon film, and anisotropically etching said insulating layer in order to form a side wall covering the side surface of said first polycrystalline silicon film and said second polycrystalline silicon film.

6. A process for production of an electrically programmable memory device, wherein a dielectric layer doped with phosphorus is formed covering a side surface of a first polycrystalline silicon film and a second polycrystalline silicon film to reduce long-term charge loss in said device, comprising the steps of:

forming a first polycrystalline silicon film over a gate silicon dioxide layer, selectively removing said first polycrystalline silicon film, forming an interlayer dielectric layer over said first polycrystalline silicon film, forming a second polycrystalline silicon film over said interlayer dielectric layer, selectivity removing said second polycrystalline silicon film, said interlayer dielectric layer, and said first polycrystalline silicon film, depositing an insulating layer over said second polycrystalline silicon film, anisotropically etching said insulating layer in order to form a side wall covering the side surface of said first polycrystalline silicon film and said second polycrystalline silicon film, doping a side surface of said side wall with phosphorus by oblique ion implantation.

7. A process for production of an electrically programmable memory device, wherein a dielectric layer doped with phosphorus is formed covering-a side surface of a first polycrystalline silicon film and a second polycrystalline silicon film to reduce long-term charge loss in said device, comprising the steps of:

forming a first polycrystalline silicon film over a gate silicon dioxide layer, selectively removing said first polycrystalline silicon film, forming an interlayer dielectric layer over said first polycrystalline silicon film, forming a second polycrystalline silicon film over said interlayer dielectric layer, selectivity removing said second polycrystalline silicon film, said interlayer dielectric layer, and said first polycrystalline silicon film, doping a side surface of said first polycrystalline silicon film and said second polycrystalline silicon film with phosphorus by predepositing a doped layer, depositing an insulating layer over said second polycrystalline silicon film, and anisotropically etching said insulating layer in order to form a side wall covering the side surface of said first polycrystalline silicon film and said second polycrystalline silicon film.

8. A process for production according to claims 1 or 2, wherein the thickness of said phosphorus containing film is at least 50 nm.

9. A process for production according to claims 1 or 3, wherein an oxidation prevention film is provided contacting a phosphorus containing film at the outer side of said phosphorus containing film in said side wall.

10. A process for production according to claims 2 or 4, wherein an oxidation prevention layer is formed contacting said phosphorus containing film at the outer side of said phosphorus containing film.

11. A process for production according to claims 2 or 4, wherein the side portions of said first polycrystalline silicon film and a second polycrystalline silicon film are not heat oxidized after said side wall is formed.

12. A process for production according to claim 9, wherein said oxidation prevention layer is a layer containing silicon nitride.

13. A process for production according to claims 2 or 4, wherein after said side wall is formed, said second polycrystalline silicon film and side wall are covered with an oxidation prevention film, then heat treatment is performed to form, by impurity diffusion, a source-drain region.

* * * * *